United States Patent
Lin et al.

(10) Patent No.: US 9,653,469 B2
(45) Date of Patent: May 16, 2017

(54) MEMORY ARRAY AND NON-VOLATILE MEMORY DEVICE OF THE SAME

(71) Applicants: Chrong-Jung Lin, Hsinchu (TW); Ya-Chin King, Taipei (TW)

(72) Inventors: Chrong-Jung Lin, Hsinchu (TW); Ya-Chin King, Taipei (TW)

(73) Assignee: Copee Technology Company, Hsinchu (TW)

( * ) Notice: Subject to any disclaimer, the term of this patent is extended or adjusted under 35 U.S.C. 154(b) by 0 days.

(21) Appl. No.: 14/476,710

(22) Filed: Sep. 3, 2014

(65) Prior Publication Data
US 2015/0076581 A1    Mar. 19, 2015

(30) Foreign Application Priority Data
Sep. 13, 2013   (TW) .............................. 102133192 A

(51) Int. Cl.
*H01L 27/112* (2006.01)
*H01L 23/525* (2006.01)

(52) U.S. Cl.
CPC .... *H01L 27/11206* (2013.01); *H01L 23/5252* (2013.01); *H01L 2924/0002* (2013.01)

(58) Field of Classification Search
CPC ........... H01L 27/11206; H01L 23/5252; H01L 2924/0002; H01L 2924/00

USPC ........................................................ 257/314
See application file for complete search history.

(56) References Cited

U.S. PATENT DOCUMENTS

| | | | |
|---|---|---|---|
| 2005/0184315 A1* | 8/2005 | Okayama | H01L 23/5252 257/209 |
| 2012/0153404 A1* | 6/2012 | Ahn | H01L 23/5252 257/402 |
| 2013/0010518 A1* | 1/2013 | Lu | H01L 27/11206 365/94 |

* cited by examiner

*Primary Examiner* — Hrayr A Sayadian
(74) *Attorney, Agent, or Firm* — CKC & Partners Co., Ltd.

(57) ABSTRACT

A non-volatile memory device is provided. The non-volatile memory device includes a substrate area, two storage units, a spacer structure and two control units. The storage units include two anti-fuse gates each having a gate dielectric layer between the anti-fuse gate and the substrate area and two diffusion areas. The spacer structure is formed on the substrate area and between the two anti-fuse gates and contacts thereto. Each of the diffusion areas is a first doping area doped with a first type dopant contacting one of the two anti-fuse gates. Each of the control units includes a select gate formed on the substrate area and a second doping area. A first side of the select gate contacts one of the diffusion areas of the storage unit. The second doping area is doped with the first type dopant and contacts a second side of the select gate.

9 Claims, 5 Drawing Sheets

MEMORY ARRAY AND NON-VOLATILE MEMORY DEVICE OF THE SAME

RELATED APPLICATIONS

This application claims priority to Taiwan Application Serial Number 102133192, filed Sep. 13, 2013, which is herein incorporated by reference.

BACKGROUND

Field of Invention

The present invention relates to a semiconductor technology. More particularly, the present invention relates to a memory array and a non-volatile memory device of the same.

Description of Related Art

The development of semiconductor memory devices having higher integration and lower power consumption has been the focus of recent research.

Non-volatile memory, nonvolatile memory, NVM or non-volatile storage, is computer memory that can retain the stored information even when not powered. Examples of non-volatile memory include read-only memory, flash memory, most types of magnetic computer storage devices (e.g. hard disks, floppy disk drives, and magnetic tape), optical disc drives, and early computer storage methods such as paper tape and punch cards.

Since the trend of the design of the electronic devices is to shrink the size thereof, it is a great challenge to keep the size of electronic components smaller without affecting the operations and the functions of the electronic devices. The present non-volatile memory fabrication technologies are not able to efficiently shrink the size of the devices even if additional fabrication processes or number of masks are used.

Accordingly, what is needed is a reliable design of the non-volatile memory devices to address the issues mentioned above.

SUMMARY

The invention provides a non-volatile memory device. The non-volatile memory device includes a substrate area, two storage units, a spacer structure and two control units. The two storage units include two anti-fuse gates and two diffusion areas. The two anti-fuse gates are formed on the substrate area and each has a gate dielectric layer between the anti-fuse gates and the substrate area. Each of the two diffusion areas is a first doping area doped with a first type dopant, wherein the two diffusion areas are formed in the substrate area and are located at two sides of the two anti-fuse gates such that the two diffusion areas contact the two anti-fuse gates respectively. The spacer structure is formed on the substrate area and is formed between the two anti-fuse gates and contacting thereto. Each of the two control units includes a select gate and a second doping area. The select gate is formed on the substrate area and includes a dielectric layer between the select gate and the substrate area, wherein a first side of the select gate contacts one of the two diffusion areas of the storage unit. The second doping area is formed in the substrate area, doped with the first type dopant and contacting a second side of the select gate.

Another aspect of the present invention is to provide a memory array. The memory array includes a plurality of non-volatile memory devices, a plurality of control lines, a plurality of first access lines and a plurality of second access lines. Each of the non-volatile memory devices includes a substrate area, two storage units, a spacer structure and two control units. The two storage units include two anti-fuse gates and two diffusion areas. The two anti-fuse gates are formed on the substrate area and each has a gate dielectric layer between the anti-fuse gates and the substrate area. Each of the two diffusion areas is a first doping area doped with a first type dopant, wherein the two diffusion areas are formed in the substrate area and are located at two sides of the two anti-fuse gates such that the two diffusion areas contact the two anti-fuse gates respectively. The spacer structure is formed on the substrate area and is formed between the two anti-fuse gates and contacting thereto. Each of the two control units includes a select gate and a second doping area. The select gate is formed on the substrate area and includes a dielectric layer between the select gate and the substrate area, wherein a first side of the select gate contacts one of the two diffusion areas of the storage unit. The second doping area is formed in the substrate area, doped with the first type dopant and contacting a second side of the select gate. Each of the control lines is electrically connected to one of the two anti-fuse gates of the two storage units of at least one of the non-volatile memory devices. Each of the first access lines is electrically connected to the select gate of one of the two control units of at least one of the non-volatile memory devices. Each of the second access lines is electrically connected to the second doping area of one of the two control units of at least one of the non-volatile memory devices.

These and other features, aspects, and advantages of the present invention will become better understood with reference to the following description and appended claims.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
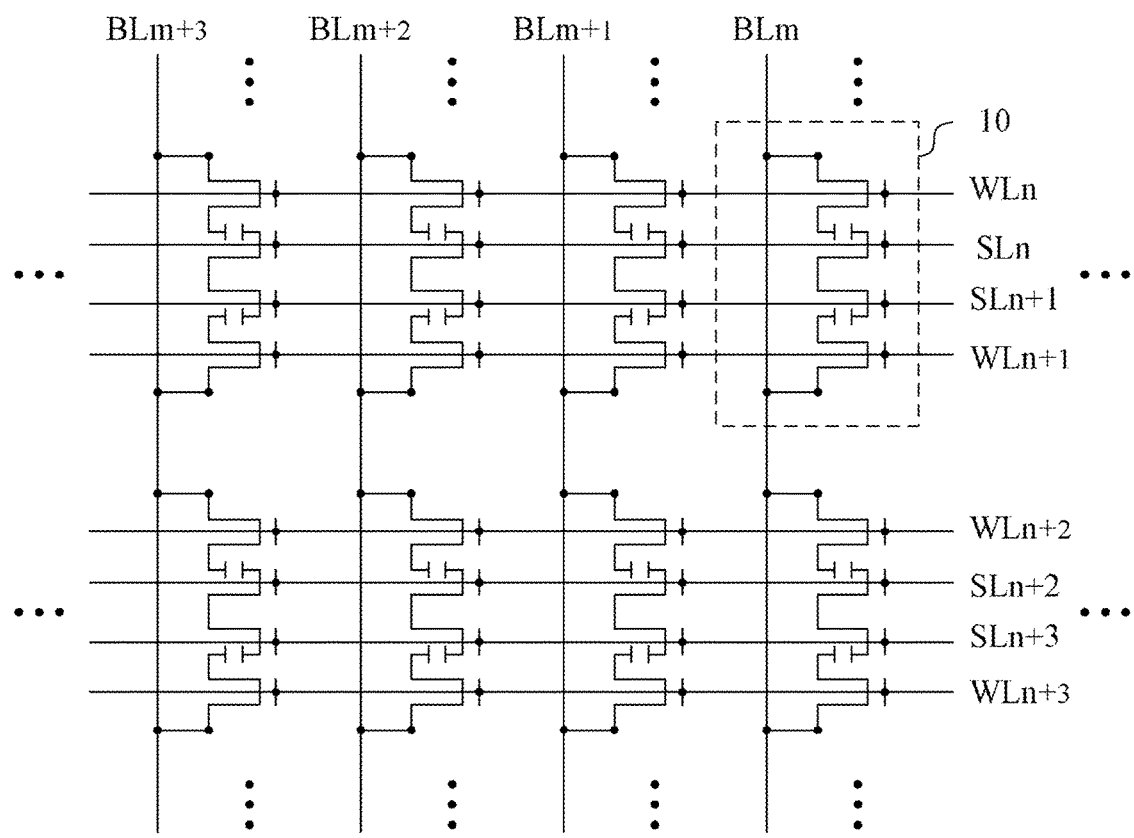
FIG. 1 is a diagram of a memory array in an embodiment of the present invention.

Reference will now be made in detail to the present embodiments of the invention, examples of which are illustrated in the accompanying drawings. Wherever possible, the same reference numbers are used in the drawings and the description to refer to the same or like parts.

FIG. 1 is a diagram of a memory array 1 in an embodiment of the present invention. The memory array 1 includes a plurality of non-volatile memory devices 10, a plurality of control lines SLn, SLn+1, . . . , SLn+3, a plurality of first access lines WLn, WLn+1, . . . , WLn+3 and a plurality of second access lines BLm, BLm+1, . . . , BLm+3.

In an embodiment, the memory array 1 is formed by the non-volatile memory devices 10 arranged in a two dimensional array. Each of the first access lines WLn, WLn+1, . . . , WLn+3 is a word line and each of the second access lines BLm, BLm+1, . . . , BLm+3 is a bit line to select at least one of the non-volatile memory devices 10. Each of the control lines SLn, SLn+1, . . . , SLn+3 is a source line. When one of the selected non-volatile memory devices 10 is selected, the non-volatile memory device 10 can be written or read according to the voltage applied by the control lines SLn, SLn+1, . . . , SLn+3.

Figure 2:
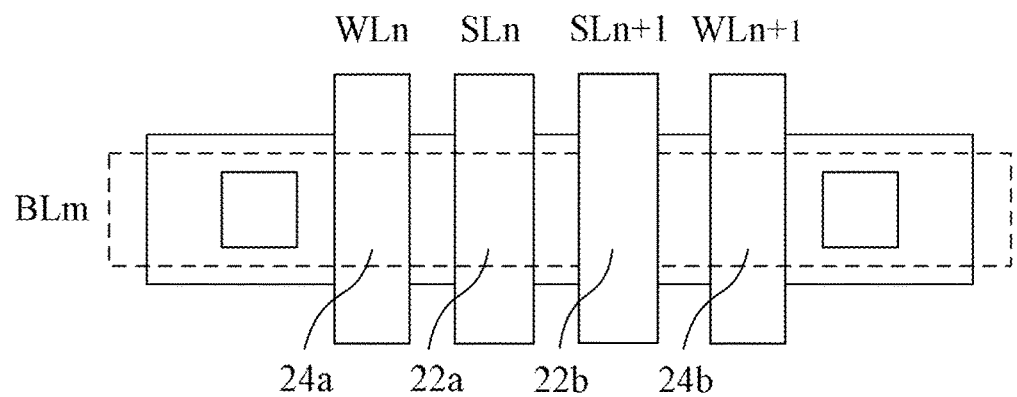
FIG. 2 is a diagram of the layout of the non-volatile memory device in an embodiment of the present invention.
Figure 3:
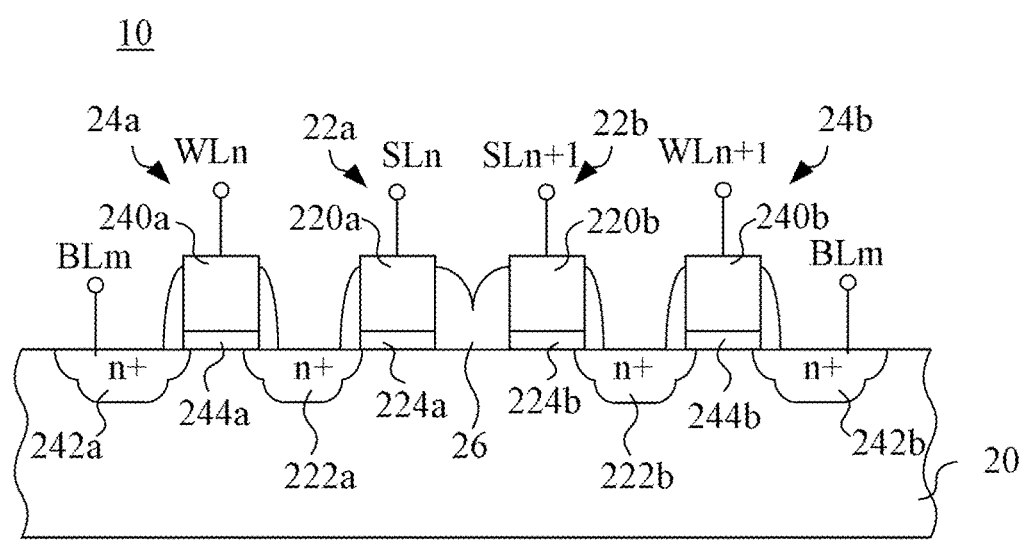
FIG. 3 is a cross-sectional view of the non-volatile memory device in an embodiment of the present invention.

FIG. 2 is a diagram of the layout of the non-volatile memory device 10 in an embodiment of the present invention. FIG. 3 is a cross-sectional view of the non-volatile memory device 10 in an embodiment of the present invention. The non-volatile memory device 10 includes a substrate area 20, two storage units 22a and 22b, two control units 24a and 24b and a spacer structure 26.

In the present embodiment, the substrate area 20 is a P-well area. The two storage units 22a and 22b include two anti-fuse gates 220a and 220b and two diffusion areas 222a and 222b.

The two anti-fuse gates 220a and 220b are formed on the substrate area 20 and have gate dielectric layers 224a and 224b, wherein the gate dielectric layer 224a is formed between the anti-fuse gate 220a and the substrate area 20, and the gate dielectric layer 224b is formed between the anti-fuse gate 220b and the substrate area 20. The anti-fuse gate 220a, the diffusion area 222a and the gate dielectric layer 224a form a data storage unit. The anti-fuse gate 220b, the diffusion area 222b and the gate dielectric layer 224b form another data storage unit.

In the present embodiment, the gate dielectric layers 224a and 224b can be oxide layers, nitride layers or layers formed by high-k material. Moreover, in the present embodiment, each of the anti-fuse gates 220a and 220b includes a gate. The gate can be a poly-Si gate or a metal gate.

Each of the two diffusion areas 222a and 222b is a first doping area doped with a first type dopant, wherein the two diffusion areas are formed in the substrate area 20. In the present embodiment, each of the two diffusion areas 222a and 222b is an N-type doping area (n+). Explained in a different way, each of the two diffusion areas 222a and 222b is formed by doping the dopant such as P or As in the substrate area 20. The diffusion area 222a is located at one side of the anti-fuse gate 220a and contacts thereto. The diffusion area 222b is located at one side of the anti-fuse gate 220b and contacts thereto.

The spacer structure 26 is formed on the substrate area 20 and is formed between the two anti-fuse gates 220a and 220b and contacting thereto. The spacer structure 26 isolates the anti-fuse gates 220a and 220b to prevent the anti-fuse gates 220a and 220b from affecting each other.

In an embodiment, the spacer structure 26 can be a single structure such that the spacer structure 26 is directly formed to cover the substrate area 20. The spacer structure 26 can also include two independent structures formed close to each other or contacting to each other. The presence of the spacer structure 26 allows the two anti-fuse gates 220a and 220b to be formed geometrically close to each other while the two anti-fuse gates 220a and 220b are still electrically isolated to each other. The storage units 22a and 22b can be shrink to a smaller size due to the presence of the spacer structure 26.

The control unit 24a includes a select gate 240a and a second doping area 242a. The control unit 24b includes a select gate 240b and a second doping area 242b. The select gates 240a and 240b are formed on the substrate area 20 and include a dielectric layer 244a and a dielectric layer 244b respectively. The dielectric layer 244a is formed between the select gate 240a and the substrate area 20. The dielectric layer 244b is formed between the select gate 240b and the substrate area 20. In the present embodiment, the dielectric layers 244a and 244b can be oxide layers, nitride layers or layers formed by high-k material.

A first side of the select gate 240a contacts the diffusion area 222a of the storage unit 22a. A first side of the select gate 240b contacts the diffusion area 222b of the storage unit 22b. The doping area 242a is formed by doping the substrate area 20 with the first type dopant, which is the N-type dopant in the present embodiment. Moreover, the doping area 242a contacts a second side of the select gate 240a. The doping area 242b is formed by doping the substrate area 20 with the first type dopant as well, which is the N-type dopant in the present embodiment. Moreover, the doping area 242b contacts a second side of the select gate 240b. As a result, the select gate 240a, the doping area 242a and the diffusion area 222a that contacts the select gate 240a together form a metal-oxide semiconductor device. The select gate 240b, doping area 242b and the diffusion area 222b that contacts the select gate 240b together form another metal-oxide semiconductor device.

The control lines SLn and SLn+1 are electrically connected to the anti-fuse gates 220a and 220b respectively. The first access lines WLn and WLn+1 (i.e. the word lines) are electrically connected to the select gates 240a and 240b respectively. The second access lines BLm (i.e. the bit line) is electrically connected to the doping areas 242a and 242b at the same time.

As a result, an anti-fuse storage structure is formed in the non-volatile memory device 10 between the diffusion area 222a and the anti-fuse gate 220a. Another anti-fuse storage structure is formed in the non-volatile memory device 10 between the diffusion area 222b and the anti-fuse gate 220b. Table 1 shown below illustrates the operation conditions when different voltages are applied to the storage unit (e.g. the storage units 22a and 22b) fabricated by the 28 nanometer process, in which these different voltages include the voltages applied by the word line, the source line, the bit line and voltage applied to the P-well.

TABLE 1

| | | Word line | Source line | Bit line | P-well |
|---|---|---|---|---|---|
| | | (Unit: volts) | | | |
| Write | Selected | 1.2 | 4 | 0 | 0 |
| | Unselected | 0 | 0 | floating | 0 |
| Read | Selected | 0.85 | 1.5 | 0 | 0 |
| | Unselected | 0 | 0 | floating | 0 |

Taking the storage unit 22a as an example, when the gate dielectric layer 224a is under a normal condition, there is no or only a few amount of current flowing therethrough under the read operation. The gate dielectric layer 224a is at an open-circuited status that represents a low state (0) in an embodiment. When the voltage of the word line (WL) is 1.2 volts and the voltage of the bit line (BL) is 0 volt, the non-volatile memory device 10 corresponding to the word line and the bit line is selected. Further, the write operation is performed according to the 4 volts voltage applied by the source line (SL) to the anti-fuse gate 220a to make the gate dielectric layer 224a breakdown. The gate dielectric layer 224a is at a short-circuited status that represents a high state (1) in an embodiment since there is a larger amount of current flowing therethrough. Therefore, such a structure in the non-volatile memory device 10 is called the anti-fuse storage structure.

As a result, the write and the read operations of the non-volatile memory device 10 in the present invention can be performed by the process described above to accomplish a data storage mechanism. The spacer structure 26 acts as a mask during the doping process for forming the diffusion areas 222a and 222b such that the area between the storage units 22a and 22b is not doped. During the write operation performed on the storage unit 22a, the spacer structure 26 prevents the neighboring storage unit 22b from damage when the high voltage for the write operation is applied to the storage unit 22a. Moreover, the presence of the spacer structure 26 allows the two anti-fuse gates 220a and 220b to be formed geometrically close to each other while the two anti-fuse gates 220a and 220b are still electrically isolated to each other. The storage units 22a and 22b can be shrink to a smaller size due to the presence of the spacer structure 26, and a smaller total area of the memory array 1 can be accomplished.

Figure 4:
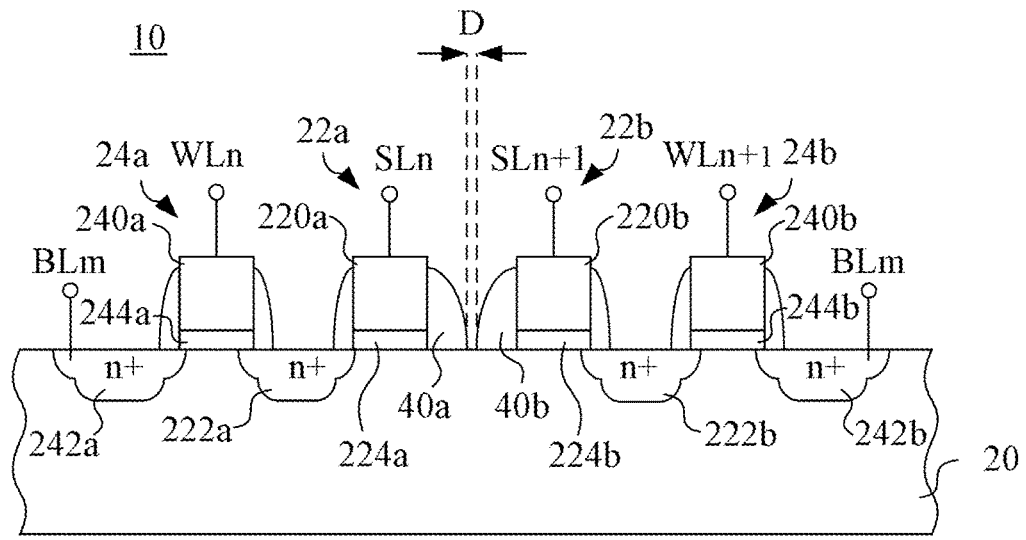
FIG. 4 is a cross-sectional view of the non-volatile memory device in another embodiment of the present invention.

FIG. 4 is a cross-sectional view of the non-volatile memory device 10 in another embodiment of the present invention. The non-volatile memory device 10 includes the substrate area 20, the two storage units 22a and 22b and the two control units 24a and 24b that are identical to these components illustrated in FIG. 3. The following description only focuses on the differences between the embodiments illustrated in FIG. 4 and FIG. 3. The identical components are not described herein.

In the present embodiment, the non-volatile memory device 10 includes two spacer structures 40a and 40b. The spacer structures 40a and 40b are formed on the substrate area 20 and contact to the anti-fuse gates 220a and 220b respectively. The two spacer structures 40a and 40b are apart from each other with a distance D. In an embodiment, the two spacer structures 40a and 40b can still provide the isolation mechanism even when the distance D therebetween is smaller than 100 nanometers such that the area between the storage units 22a and 22b is not doped during the doping process for forming the diffusion areas 222a and 222b.

Figure 5:
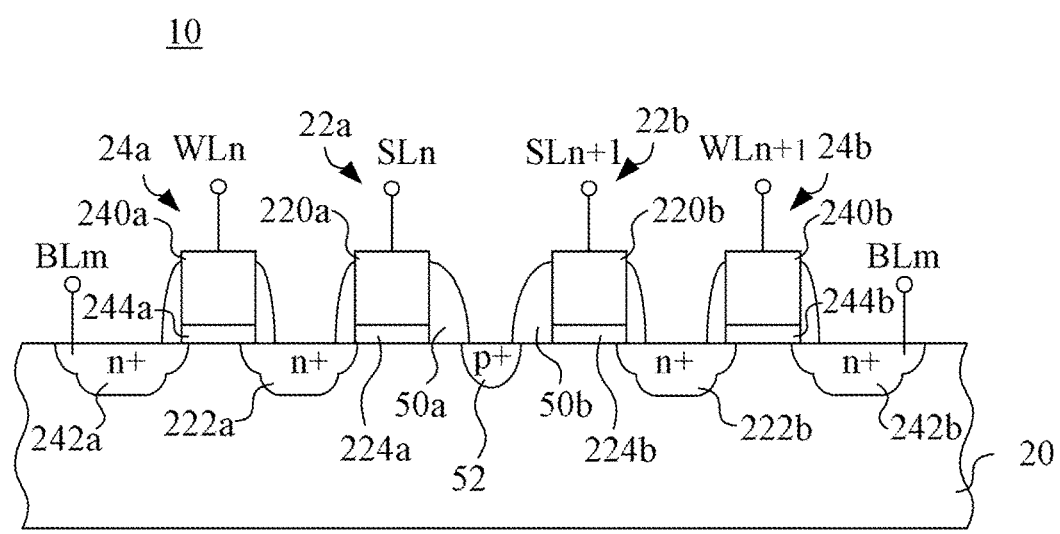
FIG. 5 is a cross-sectional view of the non-volatile memory device in another embodiment of the present invention.

FIG. 5 is a cross-sectional view of the non-volatile memory device 10 in another embodiment of the present invention. The non-volatile memory device 10 includes the substrate area 20, the two storage units 22a and 22b and the two control units 24a and 24b that are identical to these components illustrated in FIG. 3. The following description only focuses on the differences between the embodiments illustrated in FIG. 5 and FIG. 3. The identical components are not described herein.

In the present embodiment, the non-volatile memory device 10 includes two spacer structures 50a and 50b and an isolation area 52. The isolation area 52 is a doping area doped by a second type dopant. In the present embodiment, the isolation area 52 is a P-type doping area (p+). Explained in a different way, the isolation area 52 is formed by doping the dopant such as B in the substrate area 20. The isolation area 52 provides the isolation mechanism when the distance between the two spacer structures 50a and 50b are larger to isolate the storage units 22a and 22b such that the storage units 22a and 22b do not affect each other.

Figure 6A:
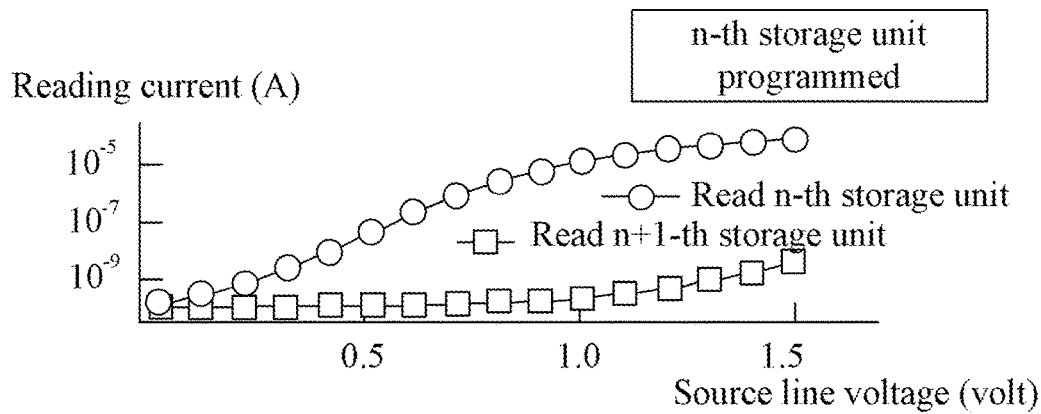
FIG. 6A is a is a diagram illustrating the reading current generated when different source line voltages are applied to the neighboring n-th and n+1-th storage units under the condition that the n-th storage unit has already been programmed in an embodiment of the present invention.

FIG. 6A is a is a diagram illustrating the reading current generated when different source line voltages are applied to the neighboring n-th and n+1-th storage units under the condition that the n-th storage unit has already been programmed (corresponding to the storage of a high level bit) in an embodiment of the present invention.

Figure 6B:
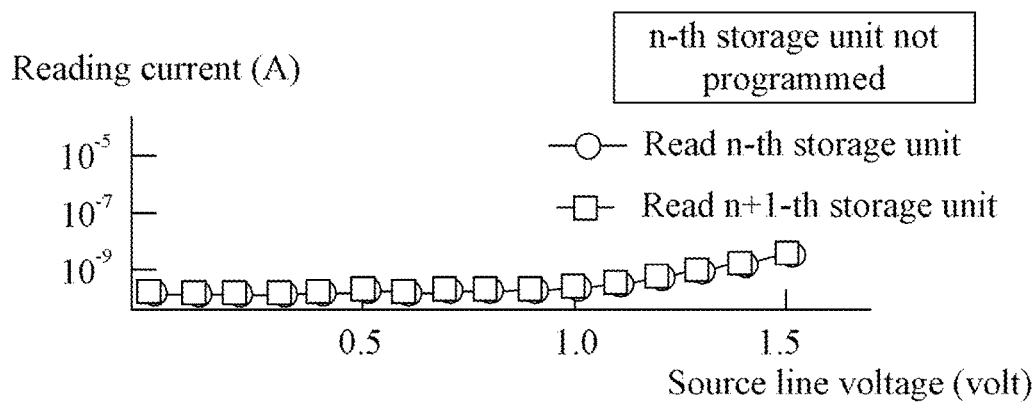
FIG. 6B is a is a diagram illustrating the reading current generated when different source line voltages are applied to the neighboring n-th and n+1-th storage units under the condition that the n-th storage unit has not been programmed in an embodiment of the present invention.

FIG. 6B is a is a diagram illustrating the reading current generated when different source line voltages are applied to the neighboring n-th and n+1-th storage units under the condition that the n-th storage unit has not been programmed (corresponding to the storage of a low level bit) in an embodiment of the present invention.

Figure 7:
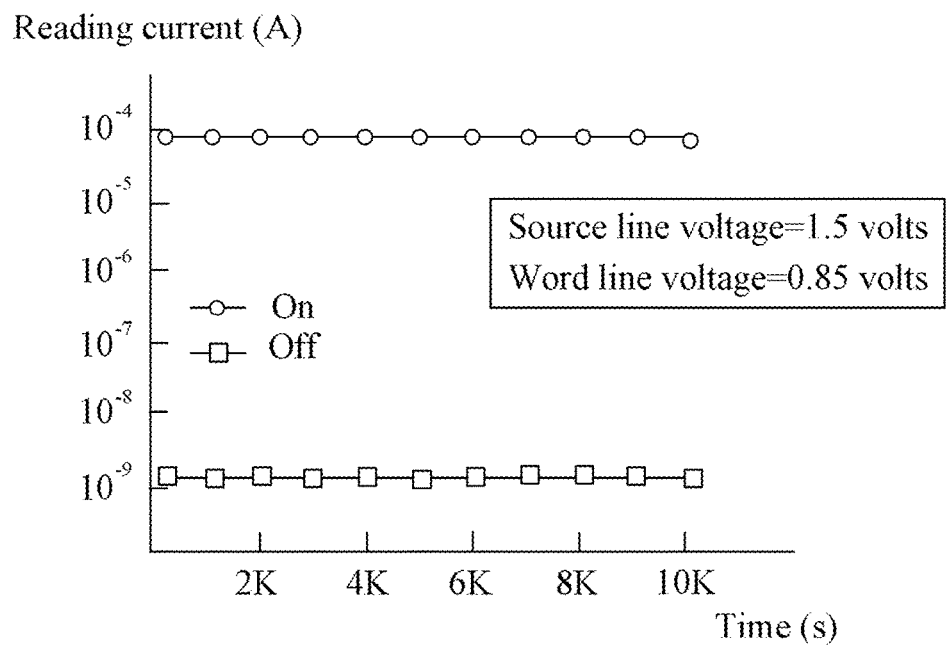
FIG. 7 is a diagram illustrating the currents of the non-volatile memory device during the on-state and during the off-state under the condition of performing the write and read operations on the non-volatile memory device for a long time in an embodiment of the present invention.

FIG. 7 is a diagram illustrating the currents of the non-volatile memory device 10 during the on-state (corresponding to the storage of the high level bit) and during the off-state (corresponding to the storage of the low level bit) under the condition of performing the write and read operations on the non-volatile memory device 10 for a long time in an embodiment of the present invention.

Figure 8:
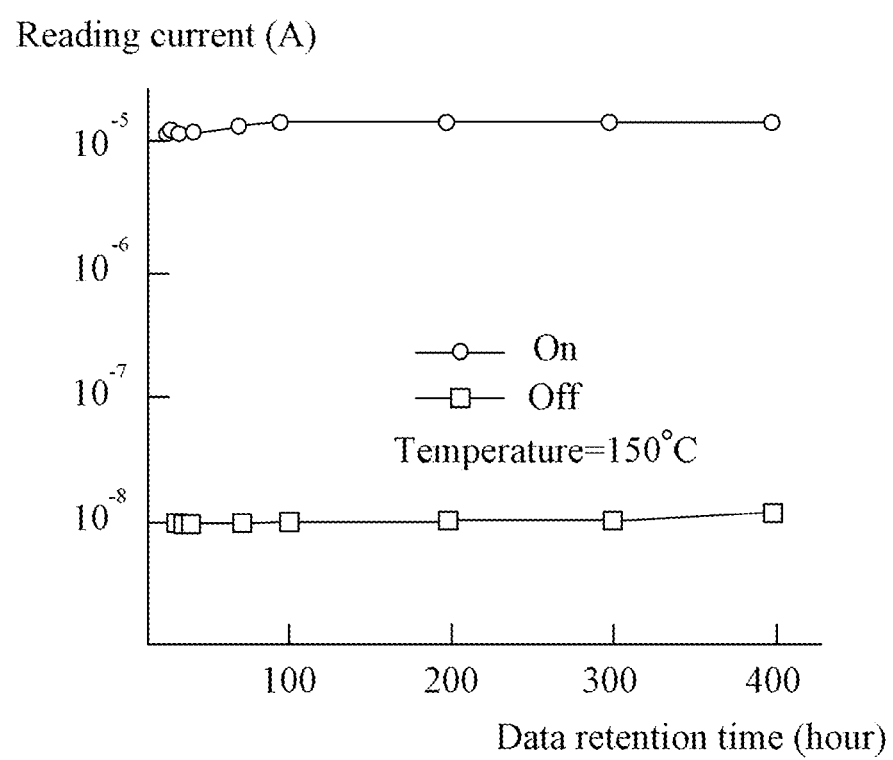
FIG. 8 is a diagram illustrating the current of the non-volatile memory device under the condition of performing high temperature baking thereon for a long time in an embodiment of the present invention.

FIG. 8 is a diagram illustrating the current of the non-volatile memory device 10 under the condition of performing high temperature baking (e.g. 450 hours; 150° C.) thereon for a long time in an embodiment of the present invention.

From the above diagrams, it is known that the memory array and the non-volatile memory device of the same can accomplish the data storage mechanism by using the anti-fuse structure. Moreover, the presence of the spacer structure can provide a good isolation between the storage units. There is no current degradation under the condition of repetitive read and write operations and under the condition of high temperature baking for a long time. Not only the isolation between the storage units is reliable, the stability of the memory array and the non-volatile memory device is also high.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A non-volatile memory device comprising:
   a substrate area;
   two storage units comprising:
      two anti-fuse gates formed on the substrate area and each having a gate dielectric layer between the anti-fuse gates and the substrate area; and
      two diffusion areas each being a first doping area doped with a first type dopant, wherein the two diffusion areas are formed in the substrate area and are located at two sides of the two anti-fuse gates such that the two diffusion areas contact the two gate dielectric layer respectively;
   a spacer structure formed on the substrate area and between the two anti-fuse gates and contacting thereto; and
   two control units each comprising:
      a select gate formed on the substrate area comprising a dielectric layer between the select gate and the substrate area, wherein a first side of the select gate contacts one of the two diffusion areas of the storage unit; and
      a second doping area formed in the substrate area, doped with the first type dopant and contacting a second side of the select gate.

2. The non-volatile memory device of claim 1, wherein each of the two anti-fuse gates is electrically connected to a control line, the select gate of each of the two control units is electrically connected to a first access line respectively and the second doping area of the two control units is electrically connected to a second access line.

3. The non-volatile memory device of claim 2, wherein the first access line is a word line and the second access line is a bit line.

4. The non-volatile memory device of claim 1, wherein each of the two anti-fuse gates and the select gate is a poly-Si gate or a metal gate.

5. The non-volatile memory device of claim 1, wherein the select gate and the second doping area of one of the two control units and the corresponding one of the two diffusion areas together form a metal-oxide semiconductor device.

6. The non-volatile memory device of claim 1, wherein the gate dielectric layer of one of the two anti-fuse gates is under a breakdown condition such that the corresponding one of the two diffusion areas is under a first data storing status.

7. The non-volatile memory device of claim 1, wherein the gate dielectric layer of one of the two anti-fuse gates is not under a breakdown condition such that the corresponding one of the two diffusion areas is under a second data storing status.

8. A memory array comprising:
   a plurality of non-volatile memory devices each comprising:
      a substrate area;
      two storage units comprising:
         two anti-fuse gates formed on the substrate area and each having a gate dielectric layer between the anti-fuse gates and the substrate area; and
         two diffusion areas each being a first doping area doped with a first type dopant, wherein the two diffusion areas are formed in the substrate area and are located at two sides of the two anti-fuse gates such that the two diffusion areas contact the two gate dielectric layer respectively;
      a spacer structure formed on the substrate area and between the two anti-fuse gates and contacting thereto; and
      two control units each comprising:
         a select gate formed on the substrate area and comprising a dielectric layer between the select gate and the substrate area, wherein a first side of the select gate contacts one of the two diffusion areas of the storage unit; and
         a second doping area formed in the substrate area, doped with the first type dopant and contacting a second side of the select gate;
   a plurality of control lines each electrically connected to one of the two anti-fuse gates of the two storage units of at least one of the plurality of non-volatile memory devices;
   a plurality of first access lines each electrically connected to the select gate of one of the two control units of at least one of the plurality of non-volatile memory devices; and
   a plurality of second access lines each electrically connected to the second doping area of one of the two control units of at least one of the plurality of non-volatile memory devices.

9. The memory array of claim 8, wherein each of the first access lines is a word line and each of the second access lines is a bit line.

* * * * *